Figures 1, 2:
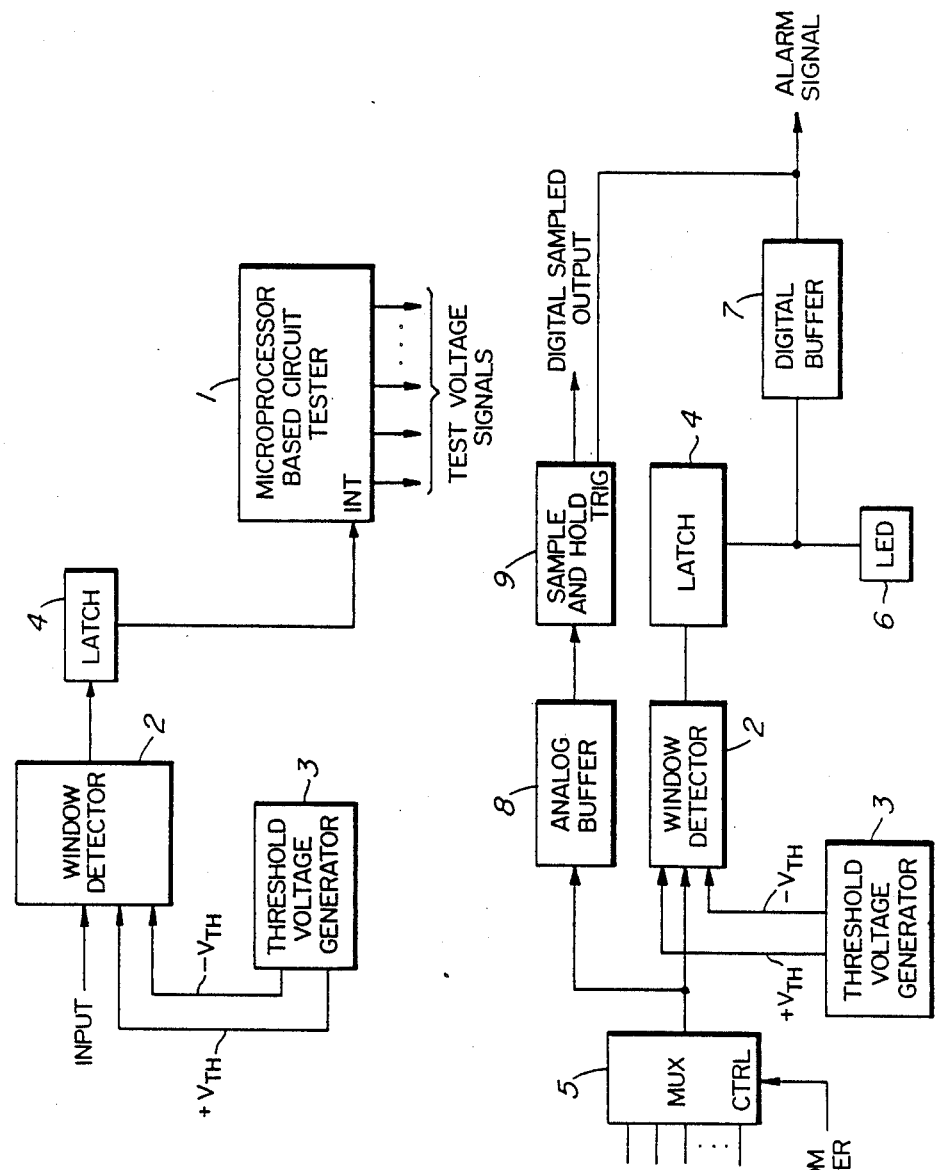

United States Patent [19]

Cline et al.

[11] Patent Number: 4,977,530
[45] Date of Patent: Dec. 11, 1990

[54] VOLTAGE MONITOR FOR IN-CIRCUIT TESTING

[75] Inventors: John Cline, Boca Raton; Ken Gentile, Green Acres City, both of Fla.

[73] Assignee: Mitel Corporation, Ontario, Canada

[21] Appl. No.: 189,180

[22] Filed: May 2, 1988

[51] Int. Cl.[5] .................. G05B 23/02; G01R 19/00
[52] U.S. Cl. .................................. 364/579; 340/661;
364/550; 364/483
[58] Field of Search ............... 364/481, 483, 550, 579;
324/76 R, 556, 73 AT; 340/636, 660, 661, 662,
663; 361/6, 90

[56] References Cited

U.S. PATENT DOCUMENTS

| | | | |
|---|---|---|---|
| 4,146,923 | 3/1979 | Borkan | 364/483 |
| 4,311,994 | 1/1982 | Kuribayashi | 340/662 |
| 4,503,479 | 3/1985 | Otsuka et al. | 340/661 |
| 4,559,497 | 12/1985 | Farrugia | 340/661 |
| 4,574,276 | 3/1986 | Sato | 340/662 |
| 4,634,971 | 1/1987 | Johnson et al. | 340/661 |
| 4,641,220 | 2/1987 | Schweitzer, Jr. | 340/663 |
| 4,701,870 | 10/1987 | Mogi et al. | 364/579 |
| 4,768,195 | 8/1988 | Stoner et al. | 324/73 AT |
| 4,779,042 | 10/1988 | Ugenti et al. | 324/73 AT |

OTHER PUBLICATIONS

*Microprocessor-Based Process Control*, by Curtis D. Johnson (Prentice-Hall, 1984) pp. 99-101.

*Engineer's Notebook II* by Forest M. Mims III (Radio Shack, 1982) pp. 87 and 90.

*Primary Examiner*—Kevin J. Teska
*Attorney, Agent, or Firm*—Antonelli, Terry, Stout & Kraus

[57] ABSTRACT

In a circuit tester for applying test voltage to circuit components, a voltage monitor for detecting potentially destructive voltages being applied to one or more additional circuit components other than the components being tested, and in response generating an alarm signal for interrupting the circuit tester, thereby inhibiting generation of the destructive voltages. Monitored input voltages are compared to selectable positive and negative threshold voltages defining upper and lower polarity sensitive destructive voltage limits.

2 Claims, 2 Drawing Sheets

VOLTAGE MONITOR FOR IN-CIRCUIT TESTING

This invention relates in general to in circuit testing systems, and more particularly to a voltage monitor in a testing system, for detecting and inhibiting generation of potentially destructive voltages applied to one or more circuit components connected to the system.

According to well known in circuit testing systems, electrical components such as integrated circuits, are tested by generating and applying predetermined test voltages to nodes connected to the components or devices under test. Such testing systems are typically microprocessor controlled, whereby a test program is executed for generating thousands of test voltages to the component under test over a period of approximately three to five minutes.

It has been found that when utilizing such test systems, potentially destructive voltages are inadvertently applied to the device under test or to surrounding devices (e.g. electrolytic capacitors) via circuit paths interconnecting the devices. These potentially destructive voltages have been known to render the devices inoperable as a result of breakdown in dielectric barriers, punch-through in transistors, etc.

Analog and digital volt-meters are well known for monitoring voltages in a circuit. In operation, a technician typically connects a pair of probes from the voltmeter or (multi meter), to a pair of nodes on a circuit to be tested and then watches a visual display in order to determine the monitored voltage.

However, as previously indicated in microprocessor or computer controlled testing systems thousands of test voltages are applied to the circuit components in an extremely short period of time. Because human reaction time is much slower than the speed at which these voltages are generated, a human operator would be unable to intercede and remove the destructive voltages in sufficient time to prevent damage to the components.

According to the present invention, a voltage monitor is provided for connection to one or more components of a circuit under test, for monitoring and comparing voltages applied to the components with predetermined selectable positive and negative threshold voltages defining an acceptable voltage range. In the event of voltage excursions outside the acceptable range, the voltage monitor generates an alarm signal for interrupting execution of the test program which is running on the test system microprocessor or computer, thereby inhibiting generation of the destructive voltages.

Accordingly, the circuit components are protected from exposure to the destructive voltages, and since execution of the test program is interrupted, a read out of the exact line code number of the program may be obtained for ascertaining which one of the multiplicity of test voltages was responsible for generation of the destructive voltage to the circuit components.

Figure 3:
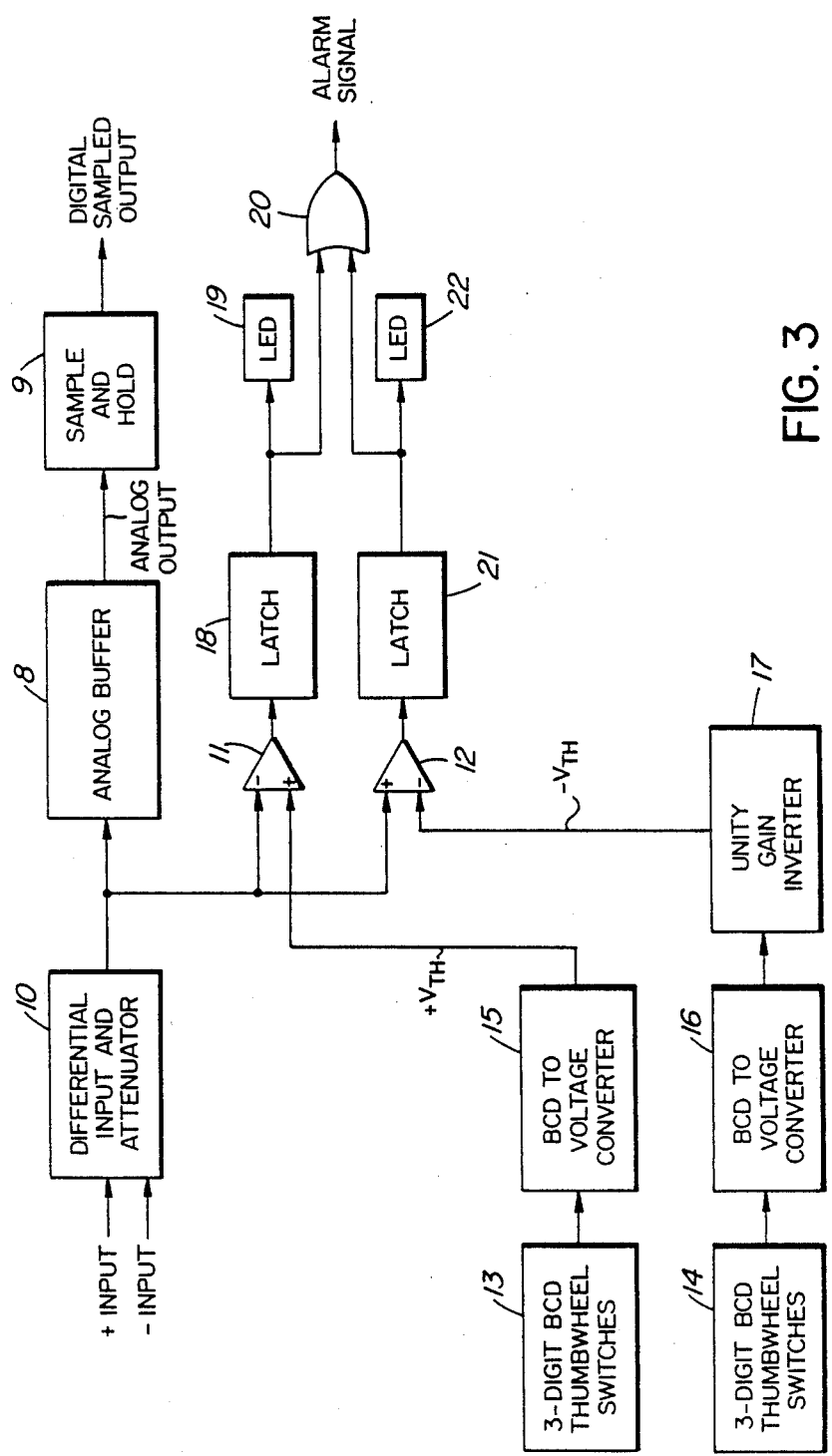

A better understanding of the present invention will be obtained with reference to the detailed description below in conjunction with the following drawings, in which:

FIG. 1 is a block diagram of a voltage monitor according to the present invention in its most general form, FIG. 2 is a block diagram of an integrated circuit voltage monitor according to a preferred embodiment of the present invention, and FIG. 3 is a block diagram of a discrete component voltage monitor according to a second alternative embodiment of the present invention.

With reference to FIG. 1, a microprocessor based circuit tester 1 is shown for applying test voltage signals to predetermined nodes of one or more components (not shown) forming a circuit under test. As previously discussed, potentially destructive voltages may inadvertently be applied to an additional one or more nodes of the component being tested, or additional components which are electrically connected to the component under test.

According to the illustrated invention, circuitry is provided for detecting and in response inhibiting generation of these destructive voltages.

In particular, the voltage carried by the aforementioned additional one or more nodes are applied as input signals to a window detector 2. Positive and negative polarity reference voltages $+V_{th}$ and $-V_{th}$ respectively, are output from a threshold voltage generator 3, for application to window detector 2.

Window detector 2 compares respective ones of the input signal voltages with the positive and negative reference voltages and in the event one or more of the input signal voltages exceed the positive reference voltage $+V_{th}$, or are less than the negative threshold voltage $-V_{th}$, window detector 2 generates a digital alarm signal which is latched via circuit 4, for application to an interrupt input INT of the microprocessor based circuit tester 1.

In response to receiving the alarm signal, the circuit tester 1 is interrupted, thereby inhibiting generation of the test voltage signals and removing the potentially destructive voltages from the monitored nodes. Furthermore, a digital read-out may be obtained from the tester 1 showing the particular line of executed code which resulted in generation of the destructive voltages, in order that the tester may be reprogrammed to execute a testing sequence which omits the offending program instruction.

A preferred embodiment is illustrated with reference to FIG. 2, for selectively monitoring voltages on a plurality on integrated circuit nodes.

A multiplexer 5 has a plurality of inputs connected to respective nodes of a circuit under test, or to additional nodes of adjacent circuits not under test. An output of multiplexer 5 is connected to an input of window detector 2, threshold voltage generator 3 has two outputs connected to the window detector 2. The output of window detector 2 is connected to the latch 4 which has an output connected to an LED 6 or other visual display, and also to a digital buffer 7 having an output thereof for generating the alarm signal.

The output of multiplexer 5 is also connected to an analog buffer 8 having an output connected to a sample-and-hold circuit 9. An output of sample-and-hold circuit 9 generates a digital sampled output of the analog signal appearing on the output of multiplexer 5, as discussed in greater detail below.

In operation, one of the plurality of inputs of multiplexer 5 is selected by means of a digital signal applied to a control input CTRL by the microprocessor-based circuit tester 1 (FIG. 1). The selected input signal is compared to the positive and negative threshold voltages $+V_{th}$ and $-V_{th}$ within window detector 2, as discussed above with reference to FIG. 1. In the event the selected input signal voltage is greater than the positive reference voltage $+V_{th}$ or less than the negative reference voltage, window detector 2 generates an alarm signal which is latched via latch circuit 4 into digital buffer 7. Latch 4 is enabled in response to a threshold violation, under control of window detector 2.

As a result, LED 6 becomes illuminated and digital buffer 7 generates the aforementioned alarm signal for application to an interrupt input of the tester 1, as discussed above with reference to FIG. 1. The digital alarm signal is also applied to a trigger input of sample-and-hold circuit 9, causing the selected analog input voltage appearing at the output of multiplexer 5 to be buffered within analog buffer circuit 8 and sampled via circuit 9 which, in response, generates a digital sampled output signal for further analysis. The digital sampled output signal forms a digital representation of the actual destructive voltage applied to the monitored node.

Hence, sufficient information is provided by the voltage monitor to enable reprogramming of the microprocessor-based circuit tester 1 for eliminating generation of the destructive voltages.

According to a successful prototype of the preferred embodiment, window detector 2 exhibited a response time of less than 50 nanoseconds, and accommodated a 30 volt differential input voltage range. Analog buffer 8 was characterized by an input impedance of greater than 100 Kohms an output impedance of approximately 50 ohms and a bandwidth of greater than 2 megahertz. Digital buffer 7 was characterized by an open collector output, sink current of approximately 50 mA, and a drain current of less than one $\mu A$ when in an open collector state.

With reference to FIG. 3, an alternative embodiment of the present invention is illustrated, for monitoring voltages appearing across discrete components, such as capacitors or resistors.

In operation, polarity sensitive inputs +INPUT and −INPUT of a different input and attenuator circuit 10 are connected across the discrete component to be monitored. Typically, a pair of probes (one red and one black) extend from the monitored device to the attenuator inputs. Polarity marking of the input probes is helpful since many discrete electronic components (e.g. electrolytic capacitors) are characterized by separate maximum forward and reverse voltage ratings.

Differential input and attenuator circuit 10 attenuates the received input signals and generates an output voltage signal having a voltage proportional to the difference between the voltages carried by the +INPUT and the −INPUT. This difference voltage signal is applied to the inverting input of a first comparator 11 and the non-inverting input of a second comparator 12.

Circuitry is provided for selecting and adjusting the minimum and maximum positive and negative threshold voltages to be applied to the discrete device or component under test. In particular, a pair of three-digit thumbwheel switches 13 and 14 are included for manually selecting positive and negative threshold voltage levels. The switches 13 and 14 generate BCD digital output signals which are applied to respective BCD-to-voltage converters 15 and 16, which in response generate corresponding DC voltage signals. The DC voltage signal output from converter 15 corresponds to the positive threshold voltage $+V_{th}$, and the DC voltage signal output from converter 16 is inverted via a unity gain inverter circuit 17, to form the negative threshold voltage $-V_{th}$.

The positive threshold voltage $+V_{th}$ is applied to the non-inverting input of comparator 11, and the negative threshold voltage is applied to the inverting input of comparator 12.

Accordingly, in the event the difference voltage output from circuit 10 is greater than the positive threshold voltage, comparator 11 generates an alarm signal for application to latch 18, and therefrom to LED circuit 19 and a first input of OR-gate 20.

Similarly, in the event the difference voltage output from circuit 10 is less than the negative threshold voltage $-V_{th}$, comparator 12 generates an alarm signal for application to latch circuit 21 and therefrom to a second input of OR-gate 20 and to LED circuit 22.

Hence, OR-gate 20 generates the aforementioned alarm signal in the event the difference voltage across the component being monitored is greater than the positive threshold voltage or less than the negative threshold voltage. The alarm signal is applied to the interrupt input of the tester 1.

As discussed above with reference to FIG. 2, an analog buffer 8 and a sample-and-hold circuit 9 are provided for generating a digital sampled output of the monitored difference signal appearing across the discrete component.

LEDs 19 and 22 provide an indication of which of the threshold limits was violated, thereby establishing the polarity of the destructive voltage.

In summary, the voltage monitor according to the present invention detects potentially destructive voltages applied to circuit components (either discrete or integrated) and generates an alarm signal for interrupting a microprocessor-based testing circuit, thereby inhibiting generation of the destructive voltage. The voltage is preferably sampled, for providing accurate information as to the extent of possible damage to the component being monitored. Furthermore, the threshold voltages may be adjusted depending on the type of circuit test being implemented.

A person understanding the present invention may conceive of other embodiments or variations therein.

For example, input overvoltage protection may be provided in order to protect the window detector 2 (FIGS. 1 and 2) or the differential input and attenuator circuit 10 (FIG. 3), from transient voltages surges. The voltage monitor may be advantageously realized in portable form, using a battery power pack.

All such modifications are believed to be within the sphere and scope of the present invention as defined in the claims appended hereto:

We claim:

1. In a computer-based system for applying test voltages to one or more circuit components, a monitor for detecting potentially destructive voltages applied to one or more circuit nodes comprised of:
   (a) input means for monitoring one or more secondary voltages carried by said nodes, said secondary voltages being generated as a result of said system applying said test voltages to said circuit components,
   (b) means for generating first and second threshold voltages, said second threshold voltage being less than said first threshold voltage by a predetermined amount,
   (c) means for comparing said secondary voltages to said first and second threshold voltages and generating an alarm signal in the event said one or more secondary voltages are either greater than said first threshold voltage or less than said second threshold voltage, thereby indicating the presence of said potentially destructive voltages, (d) means for receiving said alarm signal and in response causing interruption of operation of said computer-based system, thereby inhibiting generation of said potentially destructive voltages, (e) an analog buffer circuit connected to said input means, for receiving and buffering said one or more secondary voltages and in response to receipt of said one or more secondary voltages generating one or more buffered analog voltages, and (f) a sample and hold circuit for receiving said alarm signal and in response sampling said buffered analog voltages and generating sampled digital representations of said potentially destructive voltages applied to said one or more additional circuit components.

2. In a computer-based system for applying test voltages to one or more circuit components, a method for detecting and eliminating potentially destructive voltages applied to one or more circuit nodes comprising the steps of:

(a) monitoring said nodes for the presence of one or more secondary voltages, said secondary voltages being generated as a result of said system applying said test voltages to said circuit components, (b) generating first and second threshold voltages, said second threshold voltages being less than said first threshold voltage by a predetermined amount, (c) comparing said monitored secondary voltages to said first and second threshold voltages, (d) in the event said one or more secondary voltages are greater than said first threshold voltages or less than said second threshold voltage, generating an alarm signal, thereby indicating the presence of said potentially destructive voltages, (e) causing interruption of said computer-based system in response to generation of said alarm signal, thereby inhibiting generation of said potentially destructive voltages, and (f) sampling said one or more secondary voltages and generating a digital representation thereof in response to generation of said alarm signal, thereby providing digital representations of said potentially destructive voltages.

* * * * *